(12) United States Patent
Ledoux et al.

(10) Patent No.: US 7,323,700 B1
(45) Date of Patent: Jan. 29, 2008

(54) METHOD AND SYSTEM FOR CONTROLLING BEAM SCANNING IN AN ION IMPLANTATION DEVICE

(75) Inventors: Robert Joseph Ledoux, Harvard, MA (US); Raymond Paul Boisseau, Waltham, MA (US); William Philip Nett, Waltham, MA (US)

(73) Assignee: Applied Materials, Inc., Santa Clara, CA (US)

( * ) Notice: Subject to any disclaimer, the term of this patent is extended or adjusted under 35 U.S.C. 154(b) by 1397 days.

(21) Appl. No.: 09/822,864

(22) Filed: Apr. 2, 2001

(51) Int. Cl.
*H01J 37/304* (2006.01)

(52) U.S. Cl. .................. 250/492.21; 250/396 ML; 250/398

(58) Field of Classification Search ........... 250/492.21, 250/396 R, 396 ML, 398
See application file for complete search history.

(56) References Cited

U.S. PATENT DOCUMENTS

| | | |
|---|---|---|
| 4,494,005 A | 1/1985 | Shibata et al. |
| 4,733,091 A | 3/1988 | Robinson et al. |
| 4,922,106 A | 5/1990 | Berrian et al. |
| 5,229,615 A | 7/1993 | Brune et al. |
| 5,483,077 A | 1/1996 | Glavish |
| 5,672,879 A | 9/1997 | Glavish |
| 6,037,583 A | 3/2000 | Moehler et al. |
| 6,525,327 B1* | 2/2003 | Mitchell et al. ........ 250/492.21 |

FOREIGN PATENT DOCUMENTS

| | | |
|---|---|---|
| EP | 0 457 321 | 11/1991 |
| EP | 0 975 004 | 1/2000 |
| WO | 99/13488 | 3/1999 |

* cited by examiner

*Primary Examiner*—Kiet T. Nguyen
(74) *Attorney, Agent, or Firm*—Patterson & Sheridan, LLP

(57) ABSTRACT

A method and apparatus for controlling ion beam scanning in an ion implanter is disclosed. Before an implant process is commenced, a scan waveform to create a uniform distribution along a magnetic scan axis is determined, using a travelling Faraday detector (24). Charge data from the travelling Faraday (24) is collected into a small, finite number of channels and this is used to create a histogram of collected charge vs. beam crossing time. This is in turn used to correct a target scan velocity to compensate for any dose non-uniformity. The target scan velocity is used as a first input to a fast feedback loop. A second input is obtained by digitizing the output of an inductive pickup in the magnet of the magnetic scanner in the ion implanter. Each input is separately integrated and Fast Fourier Transformed Error coefficients $F_{error}$ are obtained by dividing. Fourier coefficients from the target scan velocity by Fourier coefficients from the inductive pickup signal. These error coefficients are used to control the command waveform to the magnetic scanner in the ion implanter.

7 Claims, 4 Drawing Sheets

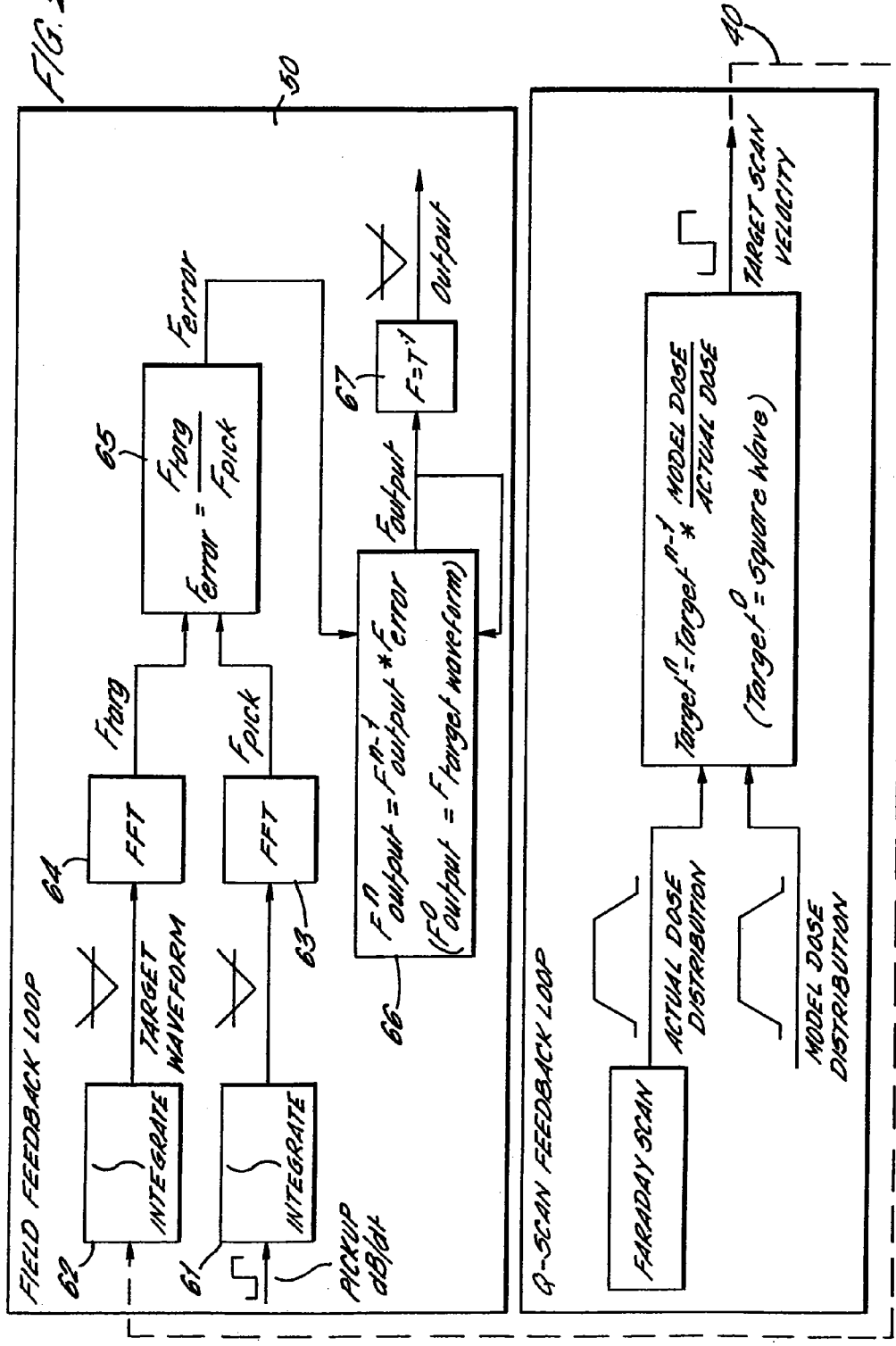

METHOD AND SYSTEM FOR CONTROLLING BEAM SCANNING IN AN ION IMPLANTATION DEVICE

FIELD OF THE INVENTION

This invention relates to a method and a system for controlling ion beam scanning with a magnetic field and is particularly suitable for use in an ion implantation device for implanting dopant ions into semiconductor wafers.

BACKGROUND OF THE INVENTION

Ion implanters have been used for many years in the processing of semiconductor wafers. Typically, a beam of ions of a required species is produced and directed at a wafer or other semiconductor substrate, so that ions become implanted under the surface of the wafer. Implantation is typically used for producing regions in the semiconductor wafer of altered conductivity state, by implantation of ions of required dopant into the wafer.

Known ion implanters include batch type implanters, of which one example is shown in U.S. Pat. No. 4,733,091 (assigned to Applied Materials, Inc.), and single wafer-type implanters, such as described in U.S. Pat. No. 5,229,615 (assigned to Eaton Corporation).

In typical batch type implanters, wafers being implanted are mechanically scanned in each of two generally orthogonal directions, repeatedly through a fixed direction ion beam, to ensure an even implantation dose over the entire wafer surface of each wafer. In typical single wafer-type implanters, the ion beam itself is scanned transversely in one orthogonal direction at a relatively high scanning rate, and the single wafer being implanted is mechanically translated to and fro across the scanned beam substantially in a second orthogonal direction.

In single wafer-type implanters, the ion beam can be scanned electrostatically or electromagnetically and it is normal practice to collimate the scanned beam so that the beam impinging on the wafer remains generally parallel to a desired beam direction during scanning.

To ensure correct implantation, a number of parameters must be controlled so as to ensure that the scanned beam covers the entire surface of the wafer being implanted. Chiefly, these are beam centering, beam parallelism, and alignment relative to the centre axis of the implanter. In order to do this, it is generally necessary to measure the ion beam and to use these measurements as a feedback for a scan controller.

Several approaches have been set out in the art to address the problem of beam scanning and/or collimation control. For example, in U.S. Pat. No. 4,494,005, assigned to Hitachi, Ltd., an ion implanter is shown wherein an ion beam is deflected by a magnetic field to scan in a fan shape across a rotary disc of wafers. Four equispaced, fixed photoelectric beam detectors are placed in front of the rotary disc and the signals obtained by these detectors are used as feedback control for a scanning velocity controller which adjusts the energization current of the magnet that generates the magnetic field for scanning.

In EP-A-0,975,004, and in EP-A-0,457,321 (Nissin Electric Co. Ltd.), two Faraday arrays are employed at respectively upstream and downstream positions to measure current density distributions of the ion beam in the transverse scanning direction at those positions. The current density distribution of the ion beam is then estimated by interpolation of the upstream and downstream data to produce an interpolated error at the wafer itself. This is used to control the beam scanning, to reduce the error.

U.S. Pat. No. 4,992,106, assigned to Varian Associates, Inc., employs a Faraday detector which is slowly translated in the same direction as the ion beam scan to obtain an integrated ion beam dose (i.e. a beam intensity) as a function of detector position. This is employed to adjust the waveform of a voltage applied to an electrostatic deflector which steers the ion beam, so as to cause the integrated beam intensity to be uniform throughout the scanning length.

U.S. patent application Ser. No. 09/686,803, assigned to Applied Materials, Inc., describes one particular implementation of a single wafer-type implanter. In this document, the contents of which are incorporated by reference in their entirety, an ion implanter is disclosed in which the ion beam is magnetically scanned to and fro relative to a wafer. A travelling Faraday is located downstream of the wafer and is employed to collect ions from the ion beam to generate a timing signal. This timing signal is in turn used as a feedback signal to the scan and collimator controllers which control beam centering, parallelism, and alignment relative to a centre axis of the implanter.

There is a general requirement, in the ion implantation process, to produce dopant concentrations of a precise magnitude and with a high degree of uniformity over the surface of the wafer being implanted. This must be done even in the presence of beam current fluctuations instrumental variations, and distortions due to ion optics. Thus it is necessary to control the dopant concentration during the course of each scan across the wafer, to obtain the desired dosing profile. Control of the scan waveform applied to the scan and/or collimator controllers is also necessary so as to govern the implantation over the whole wafer. The present invention addresses these requirements.

SUMMARY OF THE INVENTION

In general, it is an object of the invention to provide an improved method and system for controlling a waveform so as to cause it to converge with a target waveform. More specifically, it is an object to improve the beam scanning parameters by improved control of the periodically varying waveform applied to the beam scanning magnet or magnets in an ion implanter.

According to a first aspect of the present invention, there is provided a method of controlling a periodic product waveform produced by a system having a linear transfer function in response to a drive signal so as to match a target waveform, comprising the steps of: a) sensing at least one period of the product waveform and generating control input digital data representative of said waveform; b) performing a Fourier transform on said control input digital data to generate control input Fourier coefficients corresponding to said product waveform; c) performing a Fourier transform on target digital data representative of a period of said target waveform to generate target Fourier coefficients corresponding to said target waveform; d) comparing said control input Fourier coefficients and said target Fourier coefficients to generate a set of error coefficients; e) maintaining control output Fourier coefficients for use in generating said drive signal for said system; f) modifying said control output Fourier coefficients in accordance with said error coefficients to generate improved control output Fourier coefficients; g) performing an inverse Fourier transform on said improved control output Fourier coefficients to generate control output digital data representative of said drive signal for said system; and h) using said control output digital data to produce said drive signal for a subsequent period of the periodic product waveform.

By linear transfer function is meant that the response of a sum of inputs is equal to the sum of the individual responses.

In a further aspect of the present invention, there is provided a method of controlling the waveform of a periodically varying magnetic field, produced by a periodic current in a magnet winding, so as to match an intended field waveform, comprising the steps of: a) sensing at least one period of the magnetic field and generating control input digital data representative of a control input waveform which is a predetermined function of said magnetic field waveform; b) performing a Fourier transform on said control input digital data to generate control input Fourier coefficients corresponding to said control input waveform; c) performing a Fourier transform on target digital data representative of a period of a target waveform which is said predetermined function of said intended field waveform, to generate target Fourier coefficients corresponding to said target waveform; d) comparing said control input Fourier coefficients and said target Fourier coefficients to generate a set of error coefficients; e) maintaining control output Fourier coefficients for use in generating a command current waveform for producing said periodic magnetic winding current; f) modifying said control output Fourier coefficients in accordance with said error coefficients to generate improved control output Fourier coefficients; g) performing an inverse Fourier transform on said improved control output coefficients to generate control output digital data representative of a control output waveform; h) periodically generating said command current waveform from said control output digital data, said control output waveform being an inverse of said predetermined function of said command current waveform; and i) amplifying said periodic command current waveform to produce said periodic magnetic winding current.

Corresponding systems are also provided.

In still a further aspect of the present invention, there is provided a method of controlling the periodic scanning field of a scanning system of a scanned beam ion implanter, comprising measuring the dosing rate of the beam at multiple positions over the scan, determining from the measured dosing rates a target waveform which is a function of the scan speed waveform which should produce a desired distribution of said dosing rate over the scan, producing, from said target waveform, a scan drive signal for the scanning system to effect a scanning field having a waveform corresponding to a function of said target waveform, monitoring the scanning field to produce a feedback signal which is a function of the scanning field waveform such as to correspond to said target waveform, comparing a period of said feedback signal with a period of said target waveform to produce an error signal representing the difference in the waveforms of said periods, and modifying subsequent periods of said scan drive signal to reduce said error signal.

Aspects of the invention provide a highly stable system, with changes in the system due to thermal drift, electronic fluctuations and so forth being controlled and stabilized to within less than 0.1%.

Some preferred features of the present invention are set out in the dependent claims appended hereto.

BRIEF DESCRIPTION OF THE DRAWINGS

The invention may be put into practice in a number of ways, and one specific embodiment will now be described by way of example only and with reference to the accompanying drawings in which:

FIG. 2 shows a schematic diagram of the control loops used to control the waveform applied to the beam scanner of FIG. 1;

DETAILED DESCRIPTION OF THE PREFERRED EMBODIMENT

Figure 1:
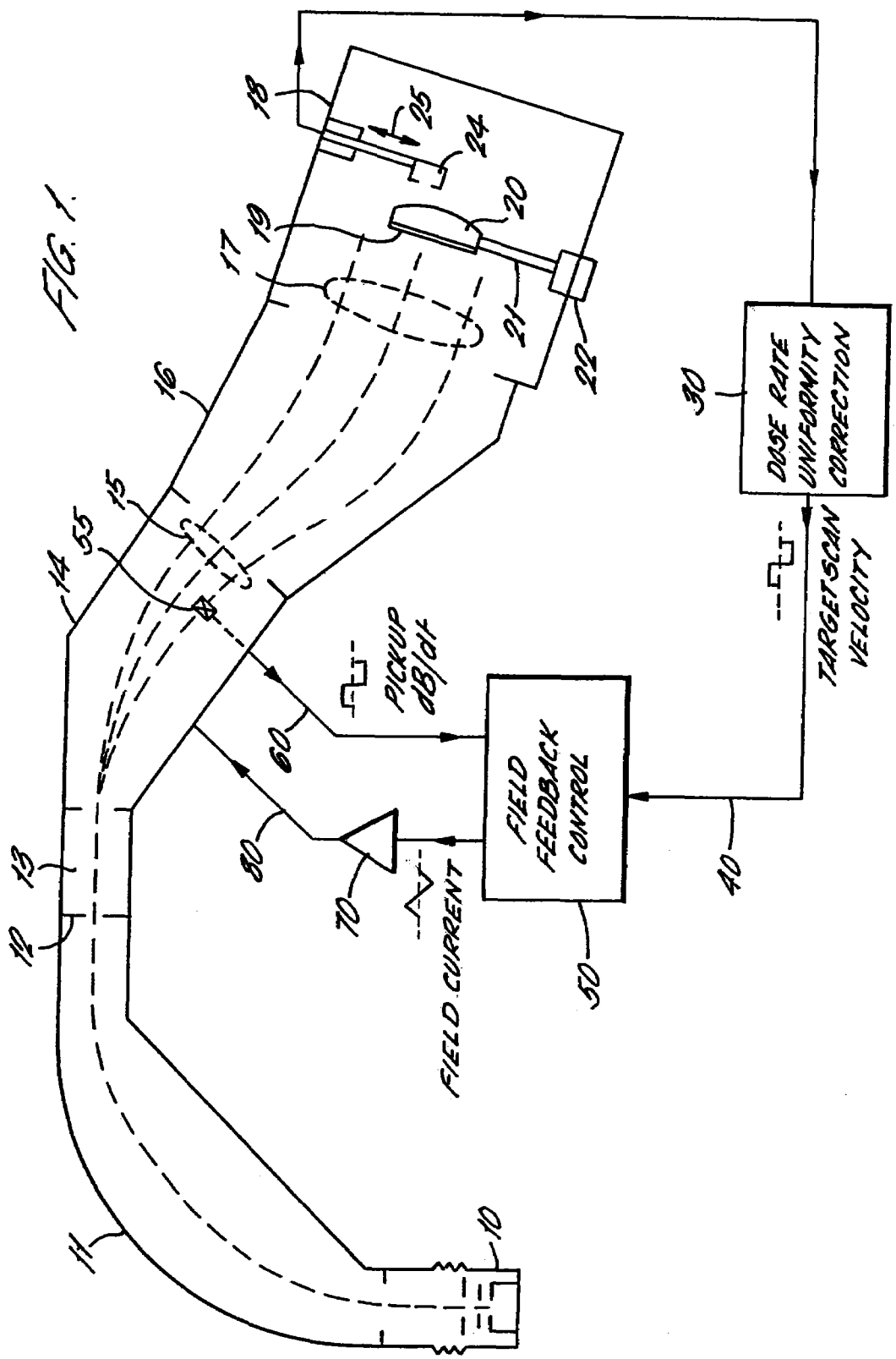
FIG. 1 shows a schematic diagram of an ion implanter device including a beam scanner and a controller therefor which embodies one aspect of the present invention.

Referring to FIG. 1, a beam of ions for implantation is produced by an ion source 10. The ions from the ion source 10 pass through an analyser magnet 11 so that only ions of a desired mass/energy ratio pass through a mass selection slit 12 at the exit of the analyser magnet 11. A beam 13 of ions of the desired mass/energy then enter a beam scanner 14 in which the beam is deflected to and fro in the plane of the paper of FIG. 1, in a direction transverse to the beam path. The beam may be scanned by the scanner 14 at a relatively high repetition rate, typically between 100 and 200 Hz.

The scanned beam 15 emerges from the scanner 14 and then enters a collimator 16. The collimator 16 is arranged to bend the scanned beam 15 by differing amounts depending on the scanned position of the beam, so that the scanned beam 17 emerging from the collimator 16 remains substantially parallel to a desired beam path as the beam is scanned to and fro.

The parallel scanned beam 17 emerging from the collimator 16 enters a process chamber 18 in which the beam may impinge upon a wafer 19 mounted on a wafer holder 20. The scanner 14 and collimator 16 are designed so that the scanned beam 17 extends right across the width of the wafer 19 on the holder 20, effectively drawing a stripe across the wafer as the beam is scanned to and fro.

The wafer holder 20 is itself mounted on a reciprocating scanning arm 21 carried by an actuator 22 which causes the wafer holder 20 and the wafer 19 thereon to execute a reciprocating motion through the plane of the scanned beam 17, so that all parts of the wafer can be implanted with the ions of the beam. Normally, the reciprocating scanning motion of the wafer holder 20 is at a relatively low repetition rate, typically of the order of 1 Hz.

The elements of the ion implanter described so far may be constituted in known ion implanters, particularly, implanters for implanting single wafers one at a time and employing a hybrid scanning system in which the ion beam is scanned transversely in one direction, whilst the wafer is mechanically reciprocated in an orthogonal direction. An ion implanter of this kind is described, for example, in WO 99/13488, the contents of which are incorporated by reference in their entirety. The ion source, mass analysis and scanning and collimating arrangements of the example of the present invention illustrated in FIG. 1 may be of kinds known to those skilled in this art. For example, the scanner 14 may use either electromagnetic or electrostatic scanning. Similarly, the collimator 16 may employ magnetic or electrostatic fields.

Although the above-mentioned prior art specification discloses a particular mechanical system for providing the reciprocation motion of the wafer holder 20 in the process chamber 18, any suitable mechanical arrangement may alternatively be employed.

Referring once more to FIG. 1, the process chamber 18, a travelling Faraday detector 24 is provided, located just behind the wafer holder 20. The travelling Faraday detector is designed to provide a current pulse in response to the ion beam scanning over the detector. The Faraday detector 24 may be employed for obtaining measurements of the ion dose rate provided by the ion beam, at various points over the scan of the ion beam. For this purpose, the travelling Faraday detector 24 can be moved transversely of the direction of the ion beam, in the direction of the arrow 25, to different positions over the range of scan of the scanned beam.

During implantation of a wafer 19 on the holder 20, the Faraday detector 24 may be located near one end of the range of scan of the ion beam, just clear of an edge of the wafer holder 20, so as to provide signals indicating the rate of dose delivery of the ion beam during implantation. Insofar as its applications have been described above, the scanning Faraday detector 24 provides the same function as the Faraday detector disclosed in the ion implanter described in the above-mentioned prior art specification WO 99/13488, as well as in commonly assigned but unpublished U.S. patent application Ser. No. 09/686,803 referenced above.

As set out above, in the case of the magnetic/mechanical hybrid implanter of FIG. 1, a fast (200 Hz) magnetic scan spreads the ion beam in the horizontal direction, with a slower mechanical scan moving the wafer in the vertical direction. The present invention relates to the manner in which the horizontal magnetic scan is controlled.

Control of the magnetic scan is achieved through two linked feedback loops. The first feedback loop determines a target scan speed which in turn provides a target scan waveform that will create a uniform charge distribution along the magnetic scan axis. The second, fast feedback loop generates a command or control output waveform which in turn is used to produce a drive signal for application to the beam scanner. The result should be convergence between a detected waveform in the magnet of the beam scanner which matches the target waveform as closely as possible.

Still referring to FIG. 1, the apparatus used to achieve feedback control via the two feedback loops is shown generally. The first, slow feedback loop, referred to hereinafter as the Q-scan feedback loop, is constituted by the travelling Faraday detector 24 and a dose rate uniformity correction algorithm 30 which, in the currently preferred embodiment, is embodied in a digital signal processor (not shown). The Q-scan feedback loop is used to generate a target scan velocity from which a target scan waveform is produced; this in turn will create a uniform charge distribution along the magnetic scan axis. The target scan waveform is generated prior to commencement of the implant process.

The extent to which the output of the Q-scan feedback loop is updated (by re-measuring the actual dose via the travelling Faraday detector 24) is user definable. The currently preferred default is to generate a new target scan velocity after every 25 wafers. However, it is possible to recalculate the target scan velocity after each wafer or, for example, each time a new implant "recipe" is selected.

The travelling Faraday detector 24 is moved slowly through the beam scan pattern. Charge data is collected from the travelling Faraday detector 24 in time intervals corresponding to a full cycle of the beam scan, and synchronised with the beam scan. This allows measurement of the integrated charge at many points along the scan. Ideally, this charge distribution will yield a constant value at every point, so that dose uniformity across the wafer is achieved. If this is not the case, then the target scan velocity must be modified to compensate for any deviation. The measurement of charge arriving at the travelling Faraday detector 24 is carried out using an electrometer which is capable of transforming small currents (of order $10^{-7}$-$10^{-2}$ Amps) into corresponding voltage signals in the order 0 to 5V which can then be digitised. The electrometer does not form a part of the present invention and will not be described in further detail.

Under normal circumstances, the desired dose distribution across the wafer is flat—that is, a series of constant values across the wafer region as measured by the travelling Faraday detector 24 should be detected. It may be possible to have a flat dose measurement and a systematically non-uniform implant profile. For this reason, the measurements made by the Faraday detector 24 are divided by a distortion array prior to use, in order to correct for the writing speed.

In preference, the Q-scan feedback loop attempts to correct the charge density for only that part of the beam scan that will pass across the wafer 19 and Faraday detector 24 in use. Scan size, wafer size, and offset parameters are used to specify this interval, and are specified in units of centimeters. The scan waveforms are in units of time, as will be explained below. The scale factor relating these quantities is the ratio of the total number of time channels to the full scan amplitude, which in the present embodiment is 32 channels/scan size.

Each fast scan cycle (that is, each sweep of the ion beam to and fro across the wafer 19) yields two dose profiles of nominally equal values, corresponding to the left-to-right and right-to-left traverses of the beam past the Faraday detector 24. As data is acquired, it is accumulated to a 32 point array, indexed by the measured beam crossing time. A second array records the number of measurements in each channel, so that the results can be normalised. A third array records the Faraday sensor position, through an analog read-back.

Figure 3A:
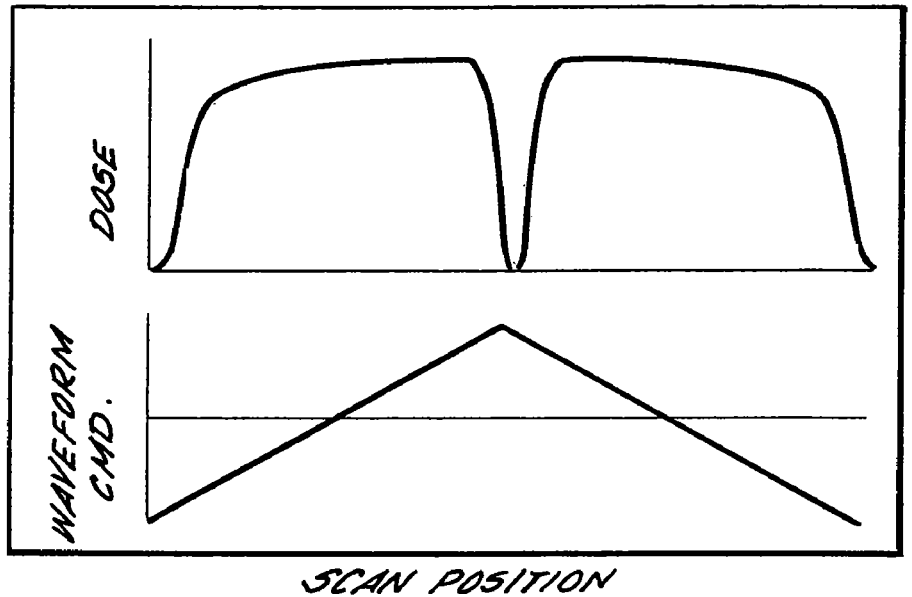
FIGS. 3a and 3b show measured ion beam dose and corresponding magnet waveform commands to obtain a uniform dose across a silicon wafer.
Figure 3B:
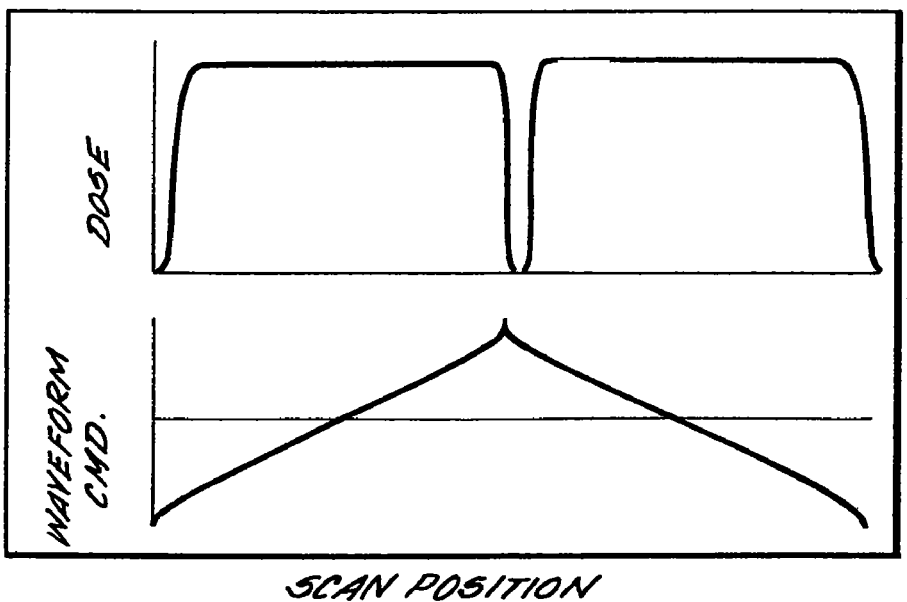

The data that has been collected is used to create a histogram of collected charge as a function of beam crossing time. This represents the charge distribution of the ion beam across the scan area. If this distribution is not flat across the region of the scan that traverses the wafer 19, such as is shown in FIG. 3a, then a correction must be made to the scan waveform. This is achieved, in the preferred embodiment, by multiplying the data collected by the travelling Faraday 24 by the model writing speed waveform used during the acquisition of that data. The result is a new model writing speed waveform which should yield a flat dose across the wafer 19 in use, as shown in FIG. 3b. It will be noted that the flat dose profile of FIG. 3b is achieved through modification of the target scan waveform from a purely triangular wave (FIG. 3a) to a non-linear but still essentially triangular target scan waveform (FIG. 3b).

The generation of the target scan waveform by the dose rate uniformity correction algorithm 30 will now be described, with reference to FIG. 2 which shows a more detailed functional diagram of both the slow and fast feedback loops introduced above. Firstly, the array of data from the travelling Faraday detector 24 is normalised by the array of data counts. The typical scan speed will accumulate approximately sixty-four measurements per "bin" over the scan area. Longer scan times will yield a higher signal-to-noise ratio. As seen in FIGS. 3a and 3b, the signal as the scan progresses through one cycle (left-to-right and right-to-left) comprises two wings. The non-zero values of each wing are fitted to a polynomial over the central range of data corresponding to the size of the wafer 19. The polynomial fit can contain up to five terms, for a fourth order fit. Although a fit using a larger number of terms will fit the curve with higher accuracy,-it will also be more susceptible to noise. A five-term fit appears to represent a good compromise, fitting the real geometric distortions with good accuracy, whilst ignoring high-frequency instabilities.

The original data obtained by the travelling Faraday detector 24 is replaced by the fitted data over the scan section corresponding to the wafer size parameter. Outside of this section, the end-point values are replicated to the ends of the array. The resulting array is then used to multiply the target writing speed, point-by-point. Next, a second multiplication is carried out by the distortion array described above, which represents a desired deviation from flatness for the dose profile. Any DC component from the resulting profile is removed, to ensure that the final profile is continuous. This profile is then normalised to 1.0 and is used as the new target writing speed waveform.

The target writing speed is normally a square wave as shown in FIG. 1 and is output on line 40 to a field feedback control which carries out the fast feedback of the drive signal applied to the beam scanner 14. After the target writing speed has been corrected, the process can be repeated to verify that the charge distribution is indeed flat, within acceptable tolerances.

Once the Q-scan feedback control has determined the correct target writing speed as described above, this profile is converted to a target scan waveform which is to be maintained against instrumental drift. This is carried out in the feedback loop shown in the upper part of FIG. 2, and referred to hereinafter as the field feedback control loop.

The target writing speed (scan velocity) which is the output of the Q-scan feedback loop on line 40 is used as a first input to a field feedback control algorithm 50 which is again, in the preferred embodiment, constituted as part of a digital signal processor. The other input to the field feedback control algorithm 50 is from a precise inductive pick-up coil 55 embedded into a face of the pole magnet that controls the beam scanning so as to be located within the magnetic field generated by the beam scanner 14. This inductive pick-up 55 generates an analog signal feedback control algorithm 50 on line 60 (FIG. 1). The inductive pick-up signal on line 60 is digitised using a 16-bit analog digital converter such as an Analog Devices AD 977A A/D converter to generate control input digital data.

The digitised signal from the inductive pick-up is a directed measurement of dB/dt, which is proportional to the writing speed of the beam. The waveform is nominally a bipolar square wave.

The digitised signal from the inductive pick-up is first integrated at integrator 61. The output of integrator 61 is then, nominally, a triangular waveform. Similarly, the target scan velocity obtained from the Q-scan feedback loop (which is also nominally a bipolar square wave) is integrated at integrator 62, and DC components are removed so that no net deflection takes place. The resultant nominally triangular target scan waveform is scaled to produce target digital data representing that scaled target scan waveform.

Next, in the field feedback control algorithm 50, each of the waveforms output from integrators 61 and 62 are subjected to Fourier transforms via FFTs 63 and 64 respectively. These generate a series of Fourier coefficients $F_{pick-up}$ and $F_{target}$. Each Fourier coefficient obtained from carrying out a Fourier transform on the target digital data is divided by a corresponding Fourier coefficient obtained by carrying out a Fourier transform on the control input digital data. This is represented at box 65 in FIG. 2.

The field feedback control algorithm 50 generates a control output waveform from which the ultimate drive signal for the beam scanner 14 is obtained. The Fourier transform of this control output waveform, which is nominally triangular, is stored by the digital signal processor which contains the field feedback control algorithm 50. To obtain the closed loop control of this control output waveform, the Fourier coefficients of the current control output waveform, obtained from error correction of the previous cycle of the control loop, are multiplied with the respective error Fourier coefficient obtained in the current cycle of the control loop. This allows an updated set of Fourier coefficients to be generated. Mathematically, this may be written $$F_{control\ output}^{n} = F_{control\ output}^{n-1} \times F_{error}$$

where $$F_{control\ output}^{o} = F_{target\ get\ waveform}$$

In other words, the initial control output waveform corresponds with the target waveform supplied by the obtained by integration of the target scan velocity output of the Q-scan feedback loop.

The final step carried out by the field feedback control algorithm is an inverse Fourier transform which is shown schematically at block 67 of FIG. 2. The output of the inverse Fourier transform is fed to a 16-bit bipolar digital-to-analog converter, such as the Linear Technologies LTC 1596-1 DAC, and is then amplified by an amplifier 70 (FIG. 1). The output of the amplifier 70 is an analog drive signal which is fed on line 80 to the beam scanner 14. The analog drive signal is established by the open loop Q-scan feedback controller prior to ion implantation, and is further modified during implantation through the closed loop field feedback loop on the basis of the detected magnetic field during implantation.

Figure 4A:
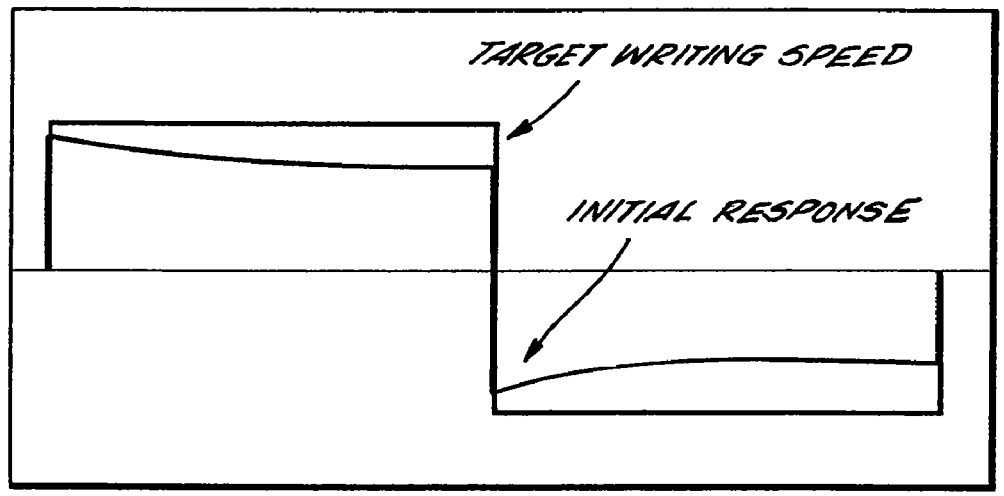
FIGS. 4a and 4b show target writing speed and actual writing speed commands before and after error correction respectively.
Figure 4B:
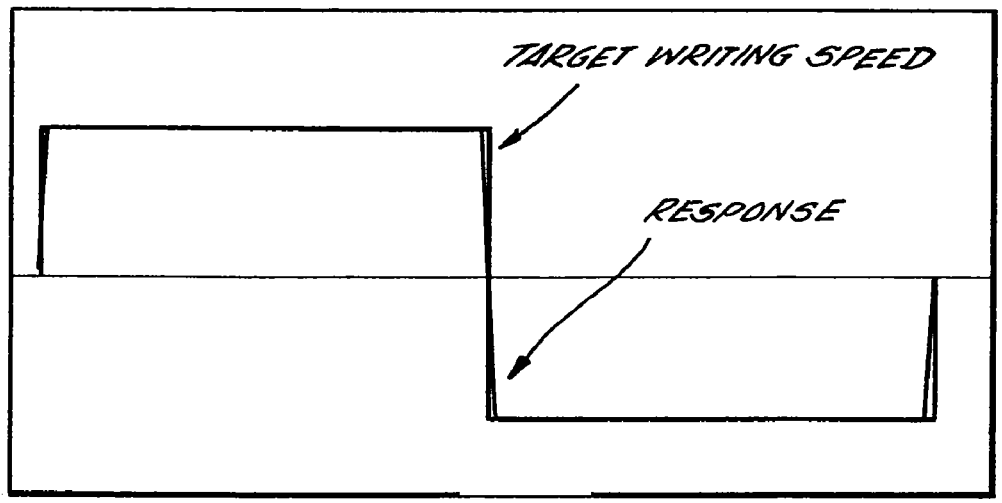

FIGS. 4a and 4b show, in writing speed space, the target writing speed and the initial measured pick-up signal (dB/dt) prior to correction of the drive signal to the magnet (FIG. 4a), and the target writing speed and the updated pick-up signal with the corrected drive signal (FIG. 4b).

One particularly preferred feature of the arrangement of FIGS. 1 and 2 is the provision of a high frequency cut-off, typically near the practical end of the response of the analog amplifier 70. This is selectable through suitable programming of the digital signal processor. By allowing a user to select a high-frequency cut-off, the field feedback control loop does not attempt to feed back on noise. Large, high frequency transients in the amplifier command are also avoided in that case.

Although one specific embodiment of the present invention has been described, it will be apparent to those of ordinary skill that a number of variations may be made without departing from the scope of the invention as defined by the appended claims. For example, the preferred implementation of the feedback loops of FIG. 2 in particular is a digital signal processor such as the Analog Devices ADPS-21062KS-160, which is a 32-bit floating-point digital signal processor capable of generating the fast Fourier transform (FFT) of a 512 point waveform in about 1 millisecond. However, other hardware and software implementations are envisaged.

Likewise, although the core of the field feedback control loop is carried out in waveform space, writing speed space (that is, target scan velocity space) could equally be used. In the latter case, and again as will be understood by those skilled in the art, the output of the Q-scan feedback loop on line 40, which is nominally a square wave representative of the target scan velocity, would not be integrated. Instead, the Fourier transform would be obtained of the square wave itself. Likewise, the output from the inductive pick-up, also nominally a square wave, would not be integrated either prior to Fourier transform. In that case, in order to generate the nominally triangular drive signal for the magnet or magnets in the beam scanner 14, the output of the inverse Fourier transform (block 67 of FIG. 2) would need to be integrated either after or, more preferably, prior to amplification by the analog amplifier 70.

Furthermore, although continuous feedback (i.e. repeated updating of the control output waveform) in the field feedback control loop is preferred, "correct once" control is also envisaged, whereby only a single updating of the control output waveform, from which the beam scanner magnet drive signal is generated, is carried out.

The invention claimed is:

1. A method of controlling the waveform of a periodically varying magnetic field, produced by a periodic current in a magnet winding, so as to match an intended field waveform, comprising the steps of:
   a) sensing at least one period of the magnetic field and generating control input digital data representative of a control input waveform which is a predetermined function of said magnetic field waveform;
   b) performing a Fourier transform on said control input digital data to generate control input Fourier coefficients corresponding to said control input waveform;
   c) performing a Fourier transform on target digital data representative of a period of a target waveform which is said predetermined function of said intended field waveform, to generate target Fourier coefficients corresponding to said target waveform;
   d) comparing said control input Fourier coefficients and said target Fourier coefficients to generate a set of error coefficients;
   e) maintaining control output Fourier coefficients for use in generating a command current waveform for producing said periodic magnetic winding current;
   f) modifying said control output Fourier coefficients in accordance with said error coefficients to generate improved control output Fourier coefficients;
   g) performing an inverse Fourier transform on said improved control output coefficients to generate control output digital data representative of a control output waveform;
   h) periodically generating said command current waveform from said control output digital data, said control output waveform being an inverse of said predetermined function of said command current waveform; and
   i) amplifying said periodic command current waveform to produce said periodic magnetic winding current.

2. A method of controlling the waveform as claimed in claim 1, in which said control input waveform is the derivative of said magnetic field waveform and said control output waveform is integrated in generating said command current waveform.

3. A method of controlling the waveform as claimed in claim 2, wherein said periodically varying magnetic field is used to scan a charge particle beam and said target waveform represents an intended writing speed of the particle beam over a fixed target.

4. A scan controller for a charged particle beam scanner employing a periodically varying magnetic field produced by a periodic current in a magnet winding from a magnet current amplifier, the controller comprising:
   a) a sensor producing a control input signal waveform having a predetermined relationship to said periodically varying magnetic field;
   b) an A/D converter generating control input digital data representative of a period of said control input signal waveform;
   c) a source of target digital data representative of a period of a target waveform which is said predetermined function of a desired beam scan position waveform;
   d) a digital signal processor receiving said control input digital data and said target digital data and generating control output digital data representative of a period of a control output waveform;
   e) a D/A converter arranged to generate a periodic demand signal for output to the magnet current amplifier, said demand signal being an inverse of said predetermined function of said control output signal; and
   f) said digital signal processor being arranged to
      i) perform a Fourier transform on said control input digital data to generate control input Fourier coefficients corresponding to said control input signal waveform;
      ii) perform a Fourier transform on said target digital data to generate target Fourier coefficients corresponding to said target waveform;
      iii) compare said control input Fourier coefficients and said target Fourier coefficients to generate a set of error coefficients;
      iv) maintain control output Fourier coefficients for use in generating said control output digital data,
      v) modify said control output Fourier coefficients in accordance with said error coefficients to generate improved control output Fourier coefficients, and
      vi) perform an inverse Fourier transform on said improved control output Fourier coefficients to generate said control output digital data.

5. A scan controller as claimed in claim 4, wherein said sensor is a sense coil producing a voltage signal which is the derivative of said magnetic field.

6. A scan controller as claimed in claim 5, wherein said target waveform represents the intended writing speed of the particle beam over a fixed target.

7. A method of controlling the periodic scanning field of a scanning system of a scanned beam ion implanter, comprising:
   measuring the dosing rate of the beam at multiple positions over the scan,
   determining from the measured dosing rates a target waveform which is a function of the scan speed waveform which should produce a desired distribution of said dosing rate over the scan, producing, from said target waveform, a scan drive signal for the scanning system to effect a scanning field having a waveform corresponding to a function of said target waveform, monitoring the scanning field to produce a feedback signal which is a function of the scanning field waveform such as to correspond to said target waveform, comparing a period of said feedback signal with a period of said target waveform to produce an error signal representing the difference in the waveforms of said periods, and modifying subsequent periods of said scan drive signal to reduce said error signal.

* * * * *

UNITED STATES PATENT AND TRADEMARK OFFICE
CERTIFICATE OF CORRECTION

PATENT NO. : 7,323,700 B1 Page 1 of 1
APPLICATION NO. : 09/822864
DATED : January 29, 2008
INVENTOR(S) : Ledoux et al.

It is certified that error appears in the above-identified patent and that said Letters Patent is hereby corrected as shown below:

Column 7, Line 11, please delete "-" before it;

Column 8, Line 23, please

Delete: "$F_{control\ output}^{n} = F_{control\ output}^{n-1} \times F_{error}$"

and

Insert: -- $F_{control\ output}^{n} = F_{control\ output}^{n-1} \times F_{error}$ --;

Column 8, Line 27, please

Delete: "$F_{control\ output}^{0} = F_{tar\ get\ waveform}$"

and

Insert: -- $F_{control\ output}^{0} = F_{target\ waveform}$ --.

Signed and Sealed this

Twelfth Day of August, 2008

JON W. DUDAS
*Director of the United States Patent and Trademark Office*